(12) United States Patent
Kuji

(10) Patent No.: US 9,905,814 B2
(45) Date of Patent: Feb. 27, 2018

(54) DISPLAY DEVICE AND METHOD OF MANUFACTURING THE SAME

(71) Applicant: Japan Display Inc., Tokyo (JP)

(72) Inventor: Takumi Kuji, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/287,111

(22) Filed: Oct. 6, 2016

(65) Prior Publication Data

US 2017/0194605 A1 Jul. 6, 2017

(30) Foreign Application Priority Data

Jan. 4, 2016 (JP) ................................ 2016-000096

(51) Int. Cl.
| H01L 51/56 | (2006.01) |
| H01L 51/00 | (2006.01) |
| H01L 51/52 | (2006.01) |

(52) U.S. Cl.
CPC ............ H01L 51/56 (2013.01); H01L 51/003 (2013.01); H01L 51/0024 (2013.01); H01L 51/0096 (2013.01); H01L 51/524 (2013.01); H01L 51/5218 (2013.01); H01L 2227/323 (2013.01); H01L 2251/566 (2013.01); Y02E 10/549 (2013.01)

(58) Field of Classification Search
CPC . H01L 51/56; H01L 51/0096; H01L 51/5218; H01L 51/524; H01L 2227/323; H01L 2251/566
See application file for complete search history.

(56) References Cited

U.S. PATENT DOCUMENTS

| 2009/0103010 A1 | 4/2009 | Okamoto et al. | |
| 2013/0095582 A1* | 4/2013 | Miyairi | H01L 51/5246 438/26 |
| 2015/0380680 A1* | 12/2015 | Sakuishi | H01L 51/5246 438/26 |
| 2016/0020422 A1* | 1/2016 | Kim | H01L 51/5228 257/40 |
| 2016/0181343 A1* | 6/2016 | Wang | H01L 27/3272 257/40 |
| 2017/0012232 A1* | 1/2017 | Kataishi | C09K 11/06 |

FOREIGN PATENT DOCUMENTS

| JP | 2004-126054 A | 4/2004 |
| JP | 2009-98425 A | 5/2009 |

* cited by examiner

*Primary Examiner* — Yasser A Abdelaziez
(74) *Attorney, Agent, or Firm* — Typha IP LLC

(57) ABSTRACT

A method of manufacturing a display device includes forming a first resin layer on a first substrate; forming a plurality of regions on the first resin layer, the plurality of regions each including a display portion, a terminal portion and a light blocking layer located between the display portion and the terminal portion; forming a second resin layer on a second substrate; bonding the first substrate and the second substrate; directing first laser light along a first line and a second line enclosing the plurality of regions such that the first laser light is transmitted through the second substrate to irradiate the first resin layer and the second resin layer; and directing second laser light along a third line parallel to the light blocking layer such that the second laser light is transmitted through the second substrate to irradiate the light blocking layer and the second resin layer.

5 Claims, 16 Drawing Sheets

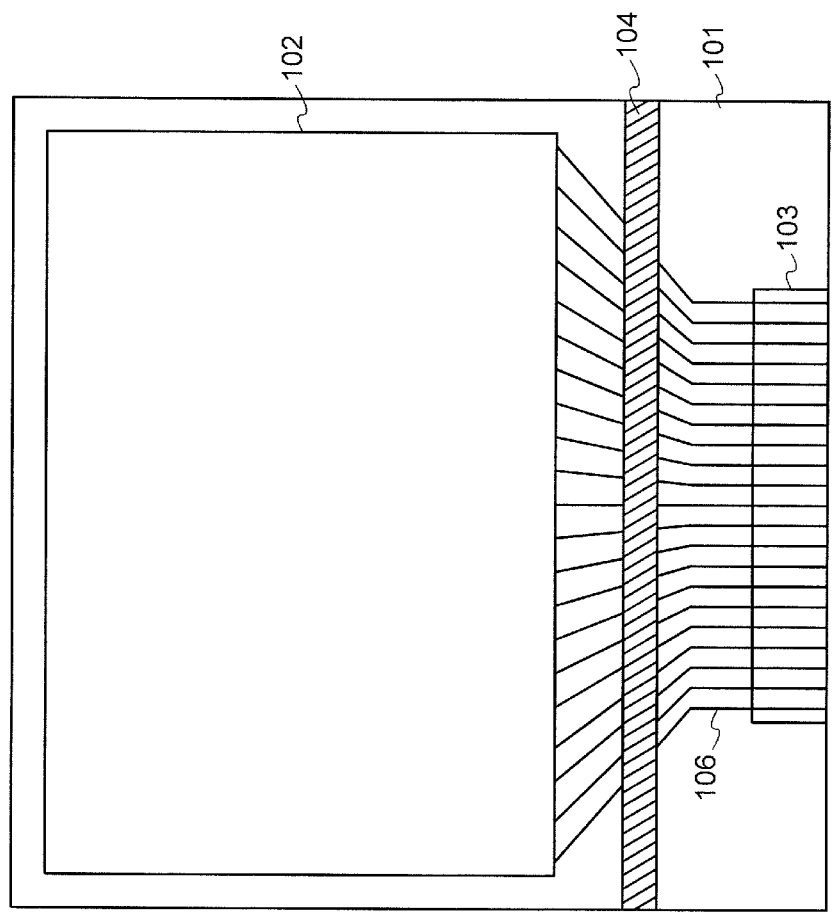

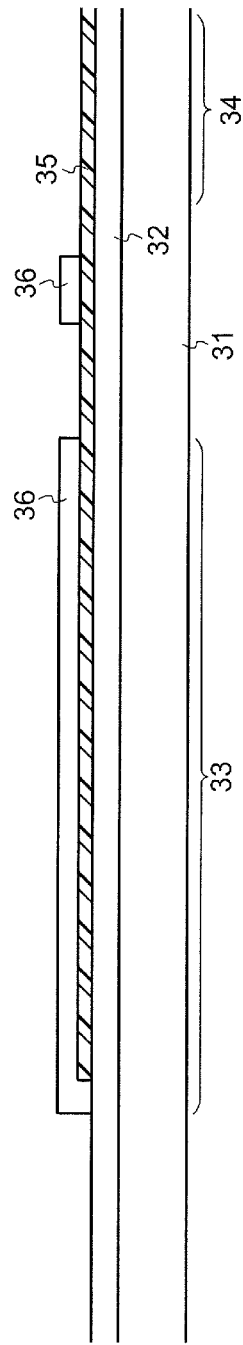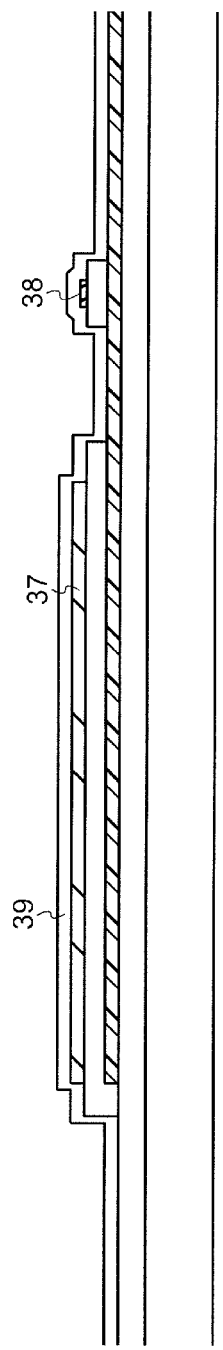

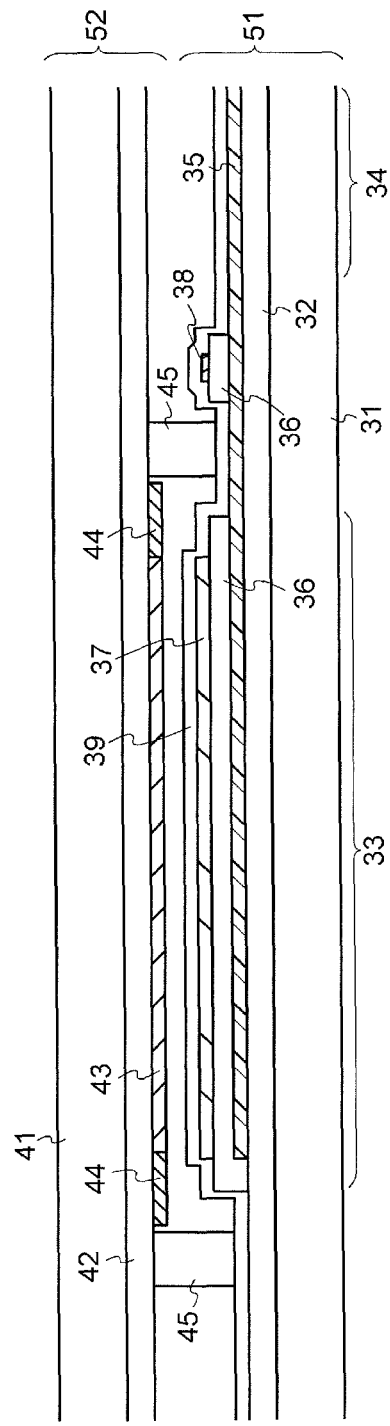

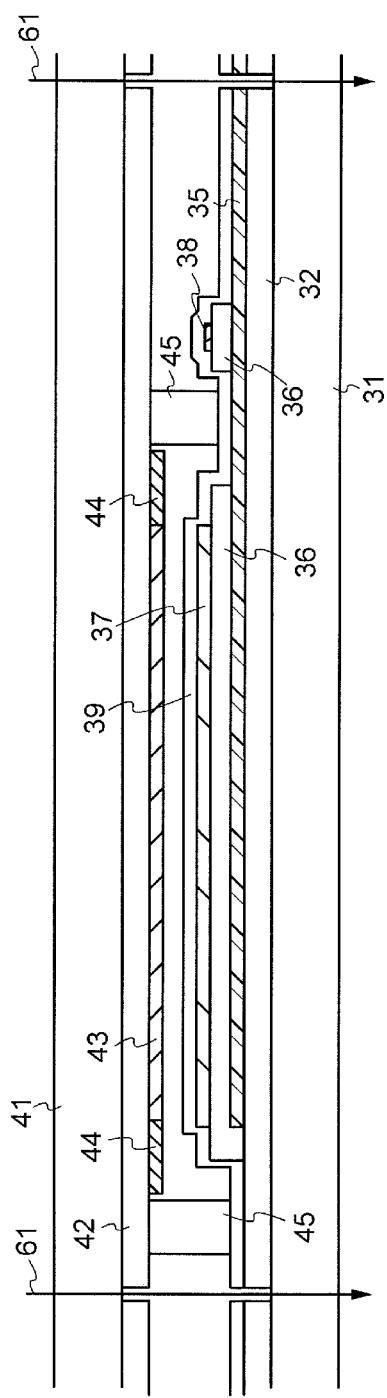

DISPLAY DEVICE AND METHOD OF MANUFACTURING THE SAME

CROSS REFERENCE TO RELATED APPLICATIONS

This application is based upon and claims the benefit of priority from the prior Japanese Patent Application No. 2016-000096 filed on 4$^{th}$ Jan. 2016, the entire contents of which are incorporated herein by reference.

FIELD

The present invention relates to a display device including a plurality of pixels and a method of manufacturing the same, and specifically to a display device including a light emitting element including an organic light emitting layer in each of the plurality of pixels, and a method of manufacturing the same.

BACKGROUND

Conventionally, LCDs (Liquid Crystal Displays) and OLED (Organic Light Emitting Diode) displays are manufactured as follows. A plurality of displays are manufactured at the same time on a large glass substrate, and then the glass substrate is cut and separated into the plurality of displays individually. In general, the glass substrate is cut by a method using a scribe cutter or a method using laser light irradiation.

An LCD and an OLED display are each generally have a structure including two glass substrates bonded together. In the above-described cutting step, the two glass substrates are cut together. However, in the state where the two glass substrates are cut in this manner, terminal portions on one of the two glass substrate, namely, an array substrate having a display circuit and the like formed thereon, are covered with the other glass substrate. Therefore, generally, after the two glass substrates are cut together, another step of cutting only the glass substrate not having the terminal portions thereon to expose the terminal portions is performed.

Examples of known technologies for selectively cutting only one of the two substrates bonded together are described in Japanese Laid-Open Patent Publications Nos. 2004-126054 and 2009-98425. According to the technologies disclosed in these publications, each of liquid crystal display devices individually separated is irradiated with laser light to cut a part of one of the two substrates, namely, a counter substrate, to expose the terminal portion on the other substrate, namely, the array substrate. Both of the publications disclose a technology for providing a metal film below a position along which the counter substrate is to be cut, so that the laser light does not hit the array substrate, which is formed of glass.

With the technologies disclosed in the above-mentioned two publications, the step of exposing the terminal portion needs to be performed after the glass substrates are separated into the individual liquid crystal display devices. Namely, the step of laser light irradiation needs to be performed on individual liquid crystal display devices separated from each other from the state of being provided between the large glass substrates. This is a factor decreasing the throughput in the mass-production of the liquid crystal display devices.

SUMMARY

A method of manufacturing a display device in an embodiment according to the present invention includes forming a first resin layer on a first substrate; forming a plurality of regions on the first resin layer, the plurality of regions each including a display portion, a terminal portion and a light blocking layer located between the display portion and the terminal portion; forming a second resin layer on a second substrate; bonding the first substrate and the second substrate such that the first resin layer and the second resin layer face each other; directing first laser light along a first line and a second line enclosing the plurality of regions such that the first laser light is transmitted through the second substrate to irradiate the first resin layer and the second resin layer with the first laser light; and directing second laser light along a third line parallel to the light blocking layer such that the second laser light is transmitted through the second substrate to irradiate the light blocking layer and the second resin layer with the second laser light.

A display device in an embodiment according to the present invention includes a first resin layer including a display portion, a terminal portion electrically connected with the display portion, and a light blocking layer located between the display portion and the terminal portion, the display portion including a light emitting element including a positive electrode, a light emitting layer and a negative electrode, and the light emitting layer forming the same layer as the positive electrode; and a second resin layer bonded to the first resin layer so as to face the first resin layer.

BRIEF DESCRIPTION OF DRAWINGS

FIG. 3 is a plan view showing the structure of the organic EL display device in embodiment 1;

FIG. 4A is a cross-sectional view showing a step of a method of manufacturing the organic EL display device in embodiment 1;

FIG. 4B is a cross-sectional view showing a step of the method of manufacturing the organic EL display device in embodiment 1;

FIG. 6 is a cross-sectional view showing a step of the method of manufacturing the organic EL display device in embodiment 1;

FIG. 7 is a cross-sectional view showing a step of the method of manufacturing the organic EL display device in embodiment 1;

DESCRIPTION OF EMBODIMENTS

Figure 1:
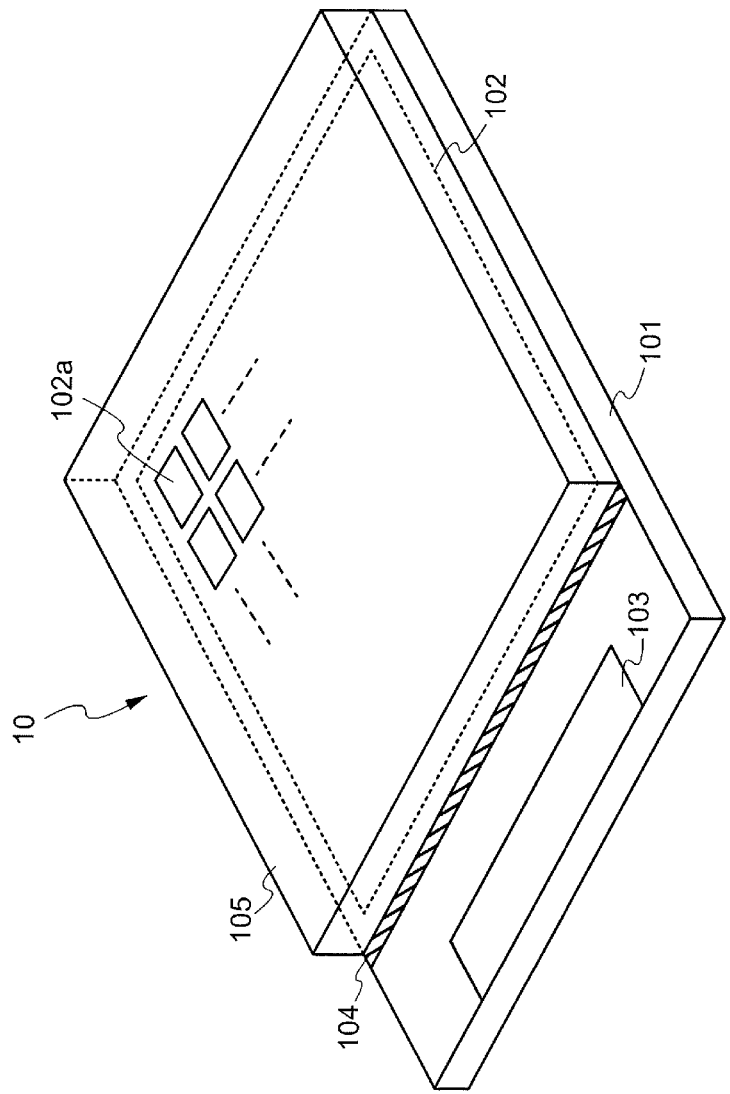
FIG. 1 schematically shows a structure of an organic EL display device in embodiment 1.

The present invention has an object of providing a simple method of manufacturing a display device having a high throughput, and a display device manufactured by such a method.

Hereinafter, embodiments of the present invention will be described with reference to the drawings and the like. The present invention may be carried out in various other embodiments without departing from the gist thereof, and should not be construed as being limited to any of the following embodiments.

In the drawings, components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those shown in a previous drawing(s) bear the identical reference signs thereto, and overlapping descriptions thereof may be omitted.

In this specification and the claims, an expression that a component or area is "on" another component or area encompasses a case where such a component or area is in contact with the another component or area and also a case where such a component or area is above or below the another component or area, namely, a case where still another component or area is provided between such a component or area and the another component or area, unless otherwise specified.

(Embodiment 1)
<Structure of the Display Device>

FIG. 1 schematically shows a structure of an organic EL display device 10 in embodiment 1. The organic EL display device 10 includes a first resin layer 101, a display portion (display region) 102 provided on the first resin layer 101, a terminal portion 103 provided on the first resin layer 101 and supplying an external signal to the display portion 102, a light blocking layer 104 located between the display portion 102 and the terminal portion 103, and a second resin layer 105 located to face the first resin layer 101. The display portion 102 includes a plurality of pixels 102a located therein. The light blocking layer 104 has a role described below.

Although not shown in FIG. 1, the first resin layer 101 may have various circuits such as a gate driver circuit, a source driver circuit, a logic circuit and the like provided thereon in addition to the display portion 102. The various circuits may be formed of thin film transistors in the same step as the display portion 102, or may be provided as external integrated circuits.

Figure 2:
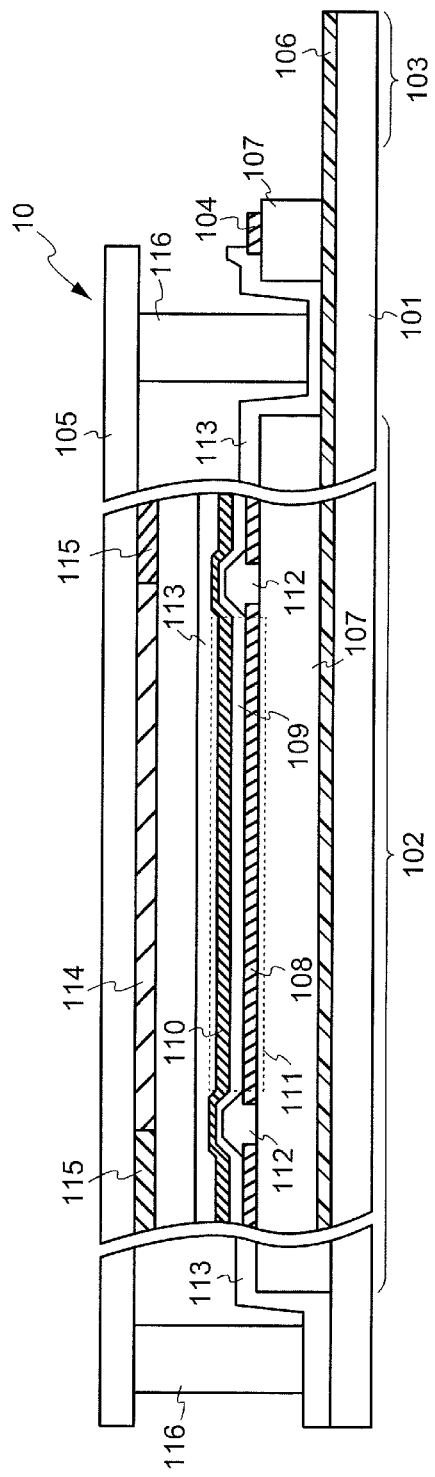
FIG. 2 is a cross-sectional view showing the structure of the organic EL display device in embodiment 1.

FIG. 2 shows a cross-sectional structure of the organic EL display device 10 in embodiment 1. As described above, the display portion 102 and the terminal portion 103 are provided on the first resin layer 101. The display portion 102 and the terminal portion 103 are connected with each other via a plurality of lines 106. The lines 106 have a role of transmitting a signal to the plurality of pixels 102a included in the display portion 102, and are usually formed of a metal material.

As shown in FIG. 1, the display portion 102 includes the plurality of pixels 102a. Each of the pixels 102a includes a plurality of thin film transistors forming a pixel circuit. The structure and the location of each pixel 102a are of a known technology. The above-described lines 106 may be formed in the same step as electrodes or lines electrically connected with the thin film transistors.

As shown in FIG. 2, the display portion 102 includes an insulating layer 107 acting as a flattening layer. The insulating layer 107 may be formed of a resin such as polyimide, acrylic resin or the like or a siloxane-based inorganic insulating material. In the organic EL display device 10 in this embodiment, the insulating layer 107 is provided in the display portion 102 and also in a portion between the display portion 102 and the terminal portion 103. A reason for this will be described below. It is preferable that the insulating layer 107 is not provided on the terminal portion 103 because the terminal portion 103 is exposed in the organic EL display device 10 as a finished product.

In the display portion 102, a positive electrode 108, an organic EL layer 109 including a light emitting layer, and a negative electrode 110 are provided on the insulating layer 107. An organic EL element 111 as the light emitting element includes the positive electrode 108, the organic EL layer 109 and the negative electrode 110. A region enclosed by a bank 112 formed of an insulating material acts as the pixel 102a. The positive electrode 108 acts as a pixel electrode located in each of the plurality of pixels 102a. The negative electrode 110 is an electrode common to all the plurality of pixels 102a, and is provided in the entirety of the display portion 102.

Basically, the positive electrode 108, the organic EL layer 109 and the negative electrode 110 have a structure provided by a known technology. It is preferable that the positive electrode 108 partially contain a metal material. In the organic EL display device 10 in this embodiment, the positive electrode 108 is formed of a stacked film including a transparent conductive layer formed of ITO (indium-tin-oxide) or the like and a metal layer formed of silver or the like. More specifically, the positive electrode 108 has a structure including two transparent conductive layers and a metal layer sandwiched between the two transparent conductive layers.

In the organic EL display device 10 in this embodiment, the light blocking layer 104 is formed in the same step as the positive electrode 108. Therefore, the light blocking layer 104 may have the same layer structure as that of the positive electrode 108. In this embodiment, the light blocking layer 104 may have, for example, a structure including two transparent conductive layers and a metal layer sandwiched between the two transparent conductive layers. Needless to say, the light blocking layer 104 does not need to have completely the same layer structure as that of the positive electrode 108, but may have a part of the structure of the positive electrode 108. It should be noted that the light blocking layer 104 needs to include a metal layer having a light blocking property. In this embodiment, the metal layer formed of silver or the like included in the positive electrode 108 acts as a metal layer having a light blocking property.

As described above, the insulating layer 107 needs to be provided below a position where the light blocking layer 104 is to be provided. FIG. 3 shows a structure of the organic EL display device 10 in this embodiment as seen in a plan view. FIG. 3 does not show the second resin layer 105.

As described above, the display portion 102 and the terminal portion 103 are connected with each other via the plurality of lines 106. Therefore, the light blocking layer 104 cross the plurality of lines 106. For this reason, it is preferable that the light blocking layer 104 and the plurality of lines 106 are insulated from each other. In order to realize this, the organic EL display device 10 in this embodiment, as shown in FIG. 2, includes the insulating layer 107 below the light blocking layer 104 to insulate the light blocking layer 104 and the lines 106 from each other.

As described above, in the organic EL display device 10 in this embodiment, a part of the metal material used for the positive electrode 108 included in the organic EL element 111 is used to form the light blocking layer 104. A conductive layer located below the insulating layer 107 is used to form the lines 106. Because of such a structure, the light blocking layer 104 and the lines 106 are insulated from each other without any specific step being added. In the case where the insulating layer 107 is formed of a material having a low dielectric constant (e.g., resin material), a capacitance formed between the light blocking layer 104 and the lines 106 is small.

Still referring to FIG. 2, the organic EL element 111 is covered with a protective layer 113. The protective layer 113 may be formed of, for example, silicon nitride, but is not limited to being formed of silicon nitride. The protective layer 113 is provided to cover the entirety of the first resin layer 101 and then is partially etched away as described below. Specifically, a part of the protective layer 113 that corresponds to a region where the first resin layer 101 and the second resin layer 105 do not overlap each other as seen in a plan view (corresponding to a region including the terminal portion 103) is selectively removed. As described below, such a step of removal may be performed by etching by use of the second resin layer 105 as a mask.

The second resin layer 105 has color filters 114 and a black mask (light blocking layer) 115 formed thereon. Neither the color filters 114 nor the black mask 115 is indispensable, and the color filters 114 or the black mask 115 may be omitted appropriately. For example, in the organic EL display device 10 in this embodiment, the color filters 114 are provided because the organic EL layer 109 is formed of a white organic EL layer. In the case where organic EL layers that emit light of different colors are provided in different pixels, the color filters 114 may be omitted. Needless to say, even in such a case, the color filters 114 of colors corresponding to the colors of the light emitted by the respective organic EL layers may be provided in order to improve the color purity. The color filters 114 and the black mask 115 may each be formed of a known material.

The first resin layer 101 and the second resin layer 105 are bonded together with a sealing member 116. In the organic EL display device 10 in this embodiment, the sealing member 116 is formed of a resin material. The sealing member 116 may be formed of any other known material. In this example, the first resin layer 101 and the second resin layer 105 are bonded together with the sealing member 116. Alternatively, the sealing member 116 may be omitted. For example, the protective layer 113 may be formed of a resin material, which may also be used to bond the first resin layer 101 and the second resin layer 105.

<Method of Manufacturing the Display Device 10>

Hereinafter, with reference to FIG. 4 through FIG. 15, a method of manufacturing the organic EL display device 10 in embodiment 1 having the above-described structure will be described.

First, with reference to FIG. 4A and FIG. 4B, a step of manufacturing an array substrate including the display portion 102 (substrate including a pixel array including the plurality of pixels), among the elements of the organic EL display device 10, will be described. As shown in FIG. 4A, a first resin layer 32 is formed on a first substrate 31. The first substrate 31 may be formed of any appropriate material. In this embodiment, the first substrate 31 is formed of glass. In this embodiment, the first resin layer 32 is formed of a polyimide resin, and has a thickness of 10 to 30 μm (typically, 20 μm). The first resin layer 32 may be formed of any other resin such as an acrylic resin or the like instead of polyimide.

Next, a display portion 33 and a terminal portion 34 are formed on the first resin layer 32. Specifically, for forming the display portion 33, thin film transistors (not shown) are formed by a known method to form a plurality of pixel circuits. In this embodiment, in the step of forming the display portion 33, lines 35 are formed of a metal material such as aluminum or the like. As shown in FIG. 3, ends of the lines 35 (in FIG. 3, the lines 106) are assembled together to form the terminal portion 34 (in FIG. 3, the terminal portion 103). After the thin film transistors are formed, an insulating layer 36 is formed to cover the thin film transistors. In this embodiment, as described above with reference to FIG. 2 and FIG. 3, the insulating layer 36 (in FIG. 2, the insulating layer 107) is formed even in a region below a region where a light blocking layer 38 (in FIG. 2, the light blocking layer 104) is to be formed later.

Next, as shown in FIG. 4B, an organic EL element 37 is formed on the insulating layer 36. FIG. 4B shows one organic EL element 37, but in actuality, an organic EL element 37 is formed in each of the pixels. As described above with reference to FIG. 2, the organic EL element 37 (in FIG. 2, the organic EL element 111) includes a positive electrode, an organic EL layer and a negative electrode.

In this embodiment, the light blocking layer 38 is formed in the same step as, and of the same materials as, the positive electrode in the organic EL element 37. Specifically, the positive electrode and the light blocking layer 38 having a structure including two transparent conductive layers formed of ITO and a metal layer formed of silver that is sandwiched between the two transparent conductive layers are formed. Needless to say, the light blocking layer 38 is not limited to having the above-described structure, but may have any other structure as long as including a metal layer having a light blocking property. A specific role of the light blocking layer 38 will be described below.

After the organic EL layer 37 is formed, a protective layer 39 is formed to cover the entirety of the first substrate 31. In this embodiment, the protective layer 39 is formed of silicon nitride. At this point, the array substrate including the display portion 33, among the elements of the organic EL display device 10, is manufactured. FIG. 4A and FIG. 4B each show a region corresponding to one array substrate. In actuality, a plurality of such regions are formed on the first substrate 31, which is large-sized. Namely, a plurality of regions each including the display portion 33, the terminal portion 34, and the light blocking layer 38 located between the display portion 33 and the terminal portion 34 are formed on the first substrate 31.

Next, with reference to FIG. 5A and FIG. 5B, a step of manufacturing, among the elements of the organic EL display device 10, a counter substrate facing the array substrate will be described.

Figure 5A:
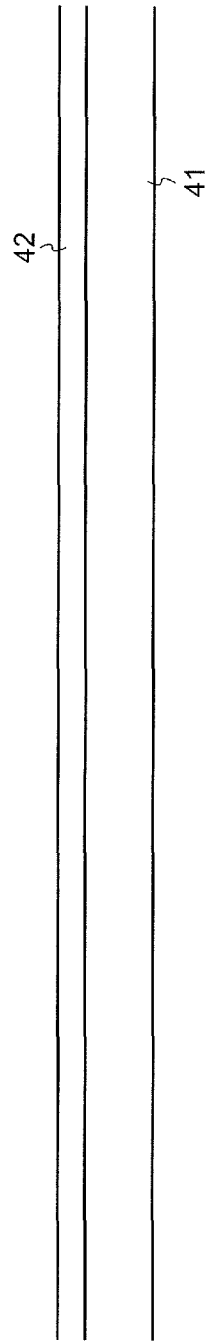
FIG. 5A is a cross-sectional view showing a step of the method of manufacturing the organic EL display device in embodiment 1.

As shown in FIG. 5A, a second resin layer 42 is formed on a second substrate 41. The second substrate 41 may be formed of a transparent material such as glass, quartz or the like. In this embodiment, the second substrate 41 is formed of glass, like the first substrate 31. In this embodiment, the second resin layer 42 is formed of a polyimide resin, and has a thickness of 10 to 30 µm (typically, 20 µm). The second resin layer 42 may be formed of any other resin such as an acrylic resin or the like instead of polyimide.

Figure 5B:
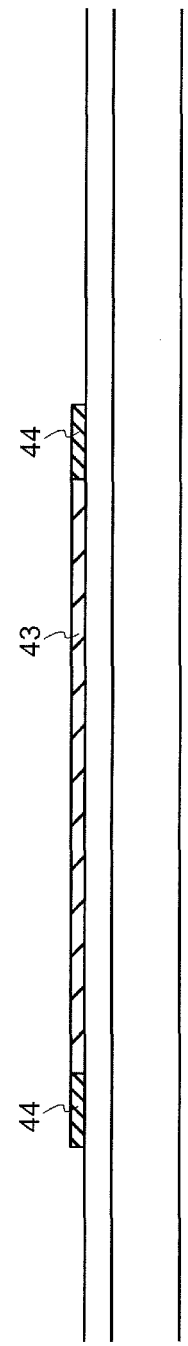
FIG. 5B is a cross-sectional view showing a step of the method of manufacturing the organic EL display device in embodiment 1.

Next, as shown in FIG. 5B, a color filter 43 and a black mask 44 are formed on the second resin layer 42. In this embodiment, the color filter 43 and the black mask 44 are formed. Either one of, or both of, the color filter 43 and the black mask 44 may be omitted.

In FIG. 5B, the color filter 43 is shown as being formed in one region. In actuality, a plurality of types of color filters 43 transmitting light of wavelengths corresponding to the colors of the light emitted in the respective pixels are formed. The black mask 44 may be formed of a metal material such as chromium or the like, or a resin material containing a black pigment dispersed therein. The color filter 43 and the black mask 44 may each have a structure provided by a known technology.

At this point, among the elements of the organic EL display device 10, the counter substrate to be located to face the array substrate is manufactured. FIG. 5A and FIG. 5B each show a region corresponding to one counter substrate. In actuality, a plurality of such regions are formed on the second substrate 41, which is large-sized. Namely, a plurality of regions each including the color filter 34 and the black mask 44 are formed on the second substrate 41.

Next, as shown in FIG. 6, the array substrate (represented by reference sign 51) manufactured by the steps shown in FIG. 4A and FIG. 4B, and the counter substrate (represented by reference sign 52) manufactured by the steps shown in FIG. 5A and FIG. 5B, are bonded together with a sealing member 45. Thus, a plurality of the organic EL display devices 10 are manufactured in the state of being provided between the first and second substrates 31 and 41.

Figure 8:
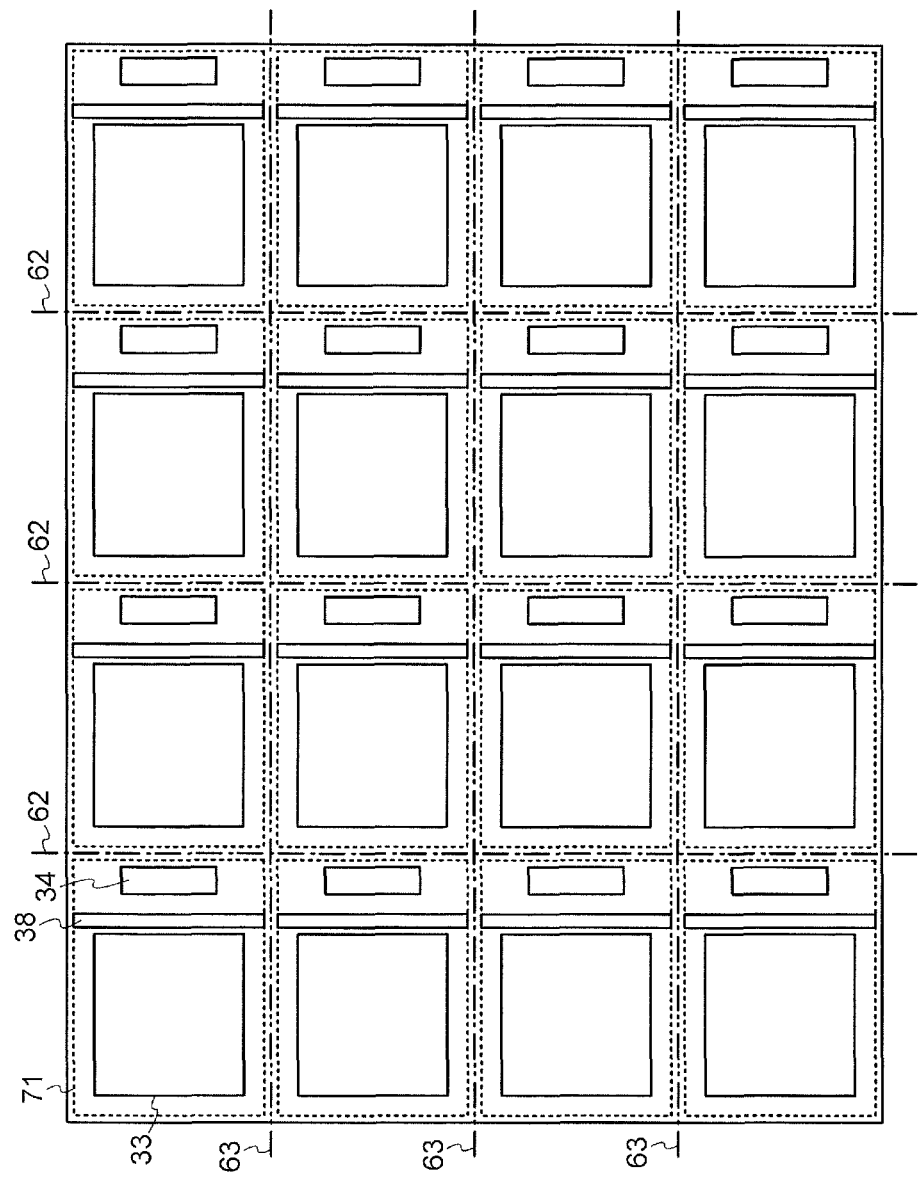
FIG. 8 is a plan view showing the step, shown in FIG. 7, of the method of manufacturing the organic EL display device in embodiment 1.

After the array substrate 51 and the counter substrate 52 are bonded together, as shown in FIG. 7 and FIG. 8, the assembly of the array substrate 51 and the counter substrate 52 is separated into the plurality of individual organic EL display devices 10 by use of first laser light 61. FIG. 7 is a cross-sectional view and FIG. 8 is a plan view both showing how the assembly of the array substrate 51 and the counter substrate 52 is irradiated with the first laser light 61.

As shown in FIG. 7, in this embodiment, the assembly of the array substrate 51 and the counter substrate 52 is irradiated with the first laser light 61 directed toward the second substrate 41 formed of glass. The second resin layer 42, the protective layer 39, the lines 35 and the first resin layer 32 are cut by the first laser light 61 transmitted through the second substrate 41. In this example, the first laser light 61 is directed toward the second substrate 41. Alternatively, the first laser light 61 may be directed toward the first substrate 31 as long as the first substrate 31 is transparent.

The first laser light 61 may be, for example, excimer laser light, but is not limited to this. The wavelength and the power of the first laser light 61 may be appropriately selected in consideration of various parameters including the material of each of the first substrate 31 and the second substrate 41, the materials of the elements to be cut, the heat-resistant temperature of each of the first resin layer 32 and the second resin layer 42, and the like.

As shown in FIG. 8, the first laser light 61 is directed along first lines 62 and second lines 63 enclosing regions 71 each including the display portion 33, the terminal portion 34 and the light blocking layer 38 (regions enclosed by the chain lines). Namely, the first laser light 61 is directed along the first lines 62 and the second lines 63 crossing each other. As a result, the regions 71 are separated from each other (it should be noted that in the state shown in FIG. 8, the regions 71 are still continuous to each other by the first substrate 31 and the second substrate 32).

Figure 9:
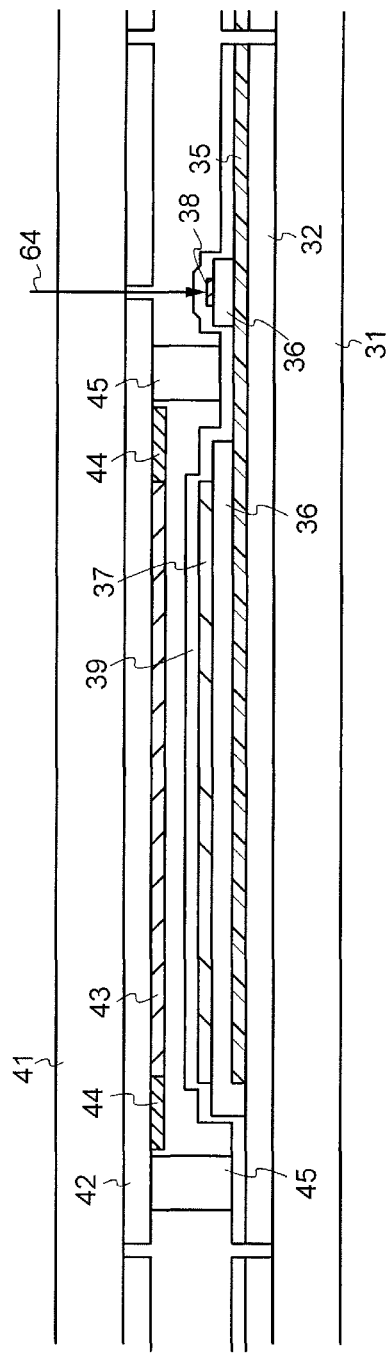
FIG. 9 is a cross-sectional view showing a step of the method of manufacturing the organic EL display device in embodiment 1.
Figure 10:
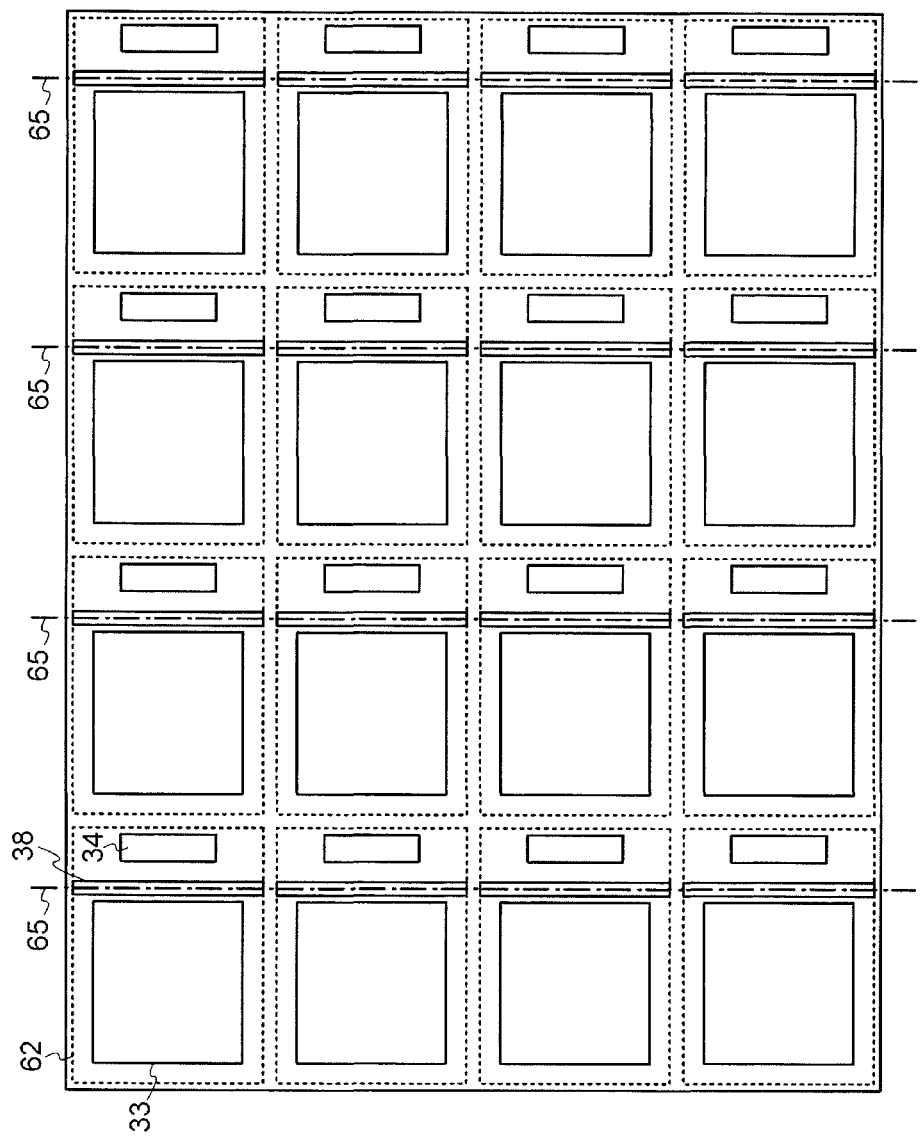
FIG. 10 is a plan view showing the step, shown in FIG. 9, of the method of manufacturing the organic EL display device in embodiment 1.

Next, as shown in FIG. 9 and FIG. 10, the second resin layer 42 is selectively cut by second laser light 64. FIG. 9 is a cross-sectional view and FIG. 10 is a plan view both showing how the assembly of the array substrate 51 and the counter substrate 52 is irradiated with the second laser light 64.

As shown in FIG. 9, in this embodiment, the assembly of the array substrate 51 and the counter substrate 52 is irradiated with the second laser light 64 directed toward the second substrate 41 formed of glass. In this embodiment, the second laser light 64 is blocked by the light blocking layer 38 in this step. Therefore, the second laser light 64 does not influence any of the insulating layer 36, the lines 35 and the first resin layer 32 located below the light blocking layer 38. For this reason, the second resin layer 42 is selectively cut by the second laser light 64 transmitted through the second substrate 41. Thus, it is preferable that the second laser light 64 has a spot diameter (diameter of an area to be irradiated with the second laser light 64) that is less than, or equal to, a line width of the light blocking layer 38. For example, in the case where the spot diameter of the second laser light 64 is 10µm, the line width of the light blocking layer 38 may be 15 to 30 µm (preferably, 20 to 25 µm).

The second laser light 64 may be, for example, excimer laser light, but is not limited to this. The wavelength and the power of the second laser light 64 may be appropriately selected in consideration of various parameters including the material of the second substrate 41, the material of the second resin layer 42, the heat-resistant temperature of the second resin layer 42, and the like.

As shown in FIG. 10, the second laser light 64 is directed along third lines 65 parallel to the light blocking layers 38. In this manner, the second resin layer 42 is cut along lines crossing regions between the display portions 33 and the terminal portions 34.

In the manner described above, the step of cutting the first resin layer 32 and the second resin layer 42 by use of the first laser light 61, and the step of cutting the second resin layer 42 by use of the second laser light 64, are finished. In this embodiment, the step of cutting by use of the first laser light 61 and the step of cutting by use of the second resin layer 42 may be performed in an opposite order.

Figure 11:
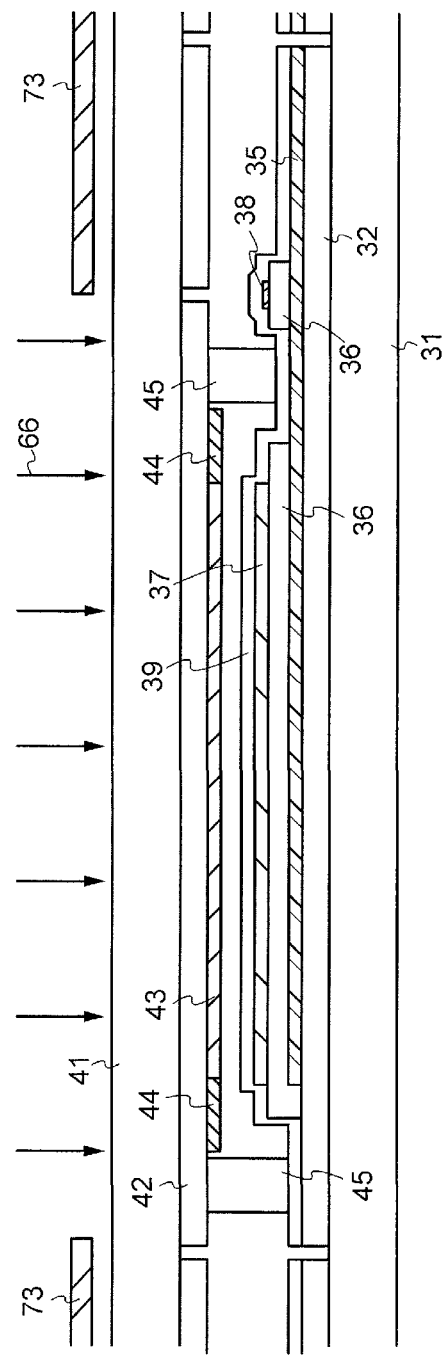
FIG. 11 is a cross-sectional view showing a step of the method of manufacturing the organic EL display device in embodiment 1.

Next, as shown in FIG. 11, the assembly of the array substrate 51 and the counter substrate 52 is irradiated with third laser light 66 directed toward the second substrate 41 in the state where a light blocking mask 73 is provided on the second substrate 41. In this step, a part of an interface between the second substrate 41 and the second resin layer 42 is selectively supplied with energy by the third laser light 66, which has power lower than that of each of the first laser light 61 and the second laser light 64. As a result, the adhesiveness between the second substrate 41 and the second resin layer 42 at the part of the interface is decreased.

Figure 12:
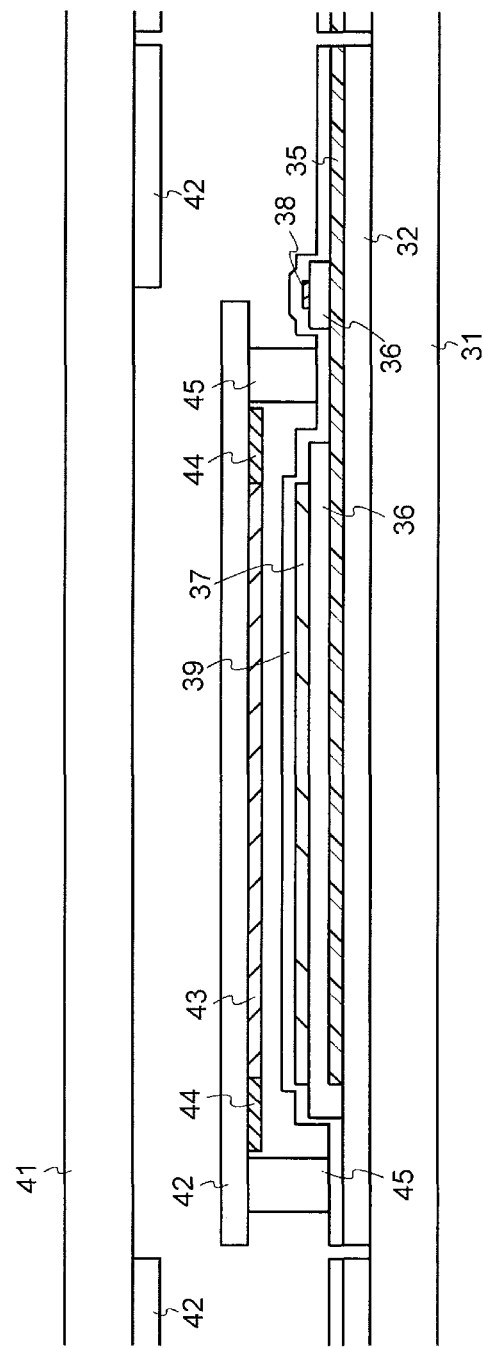
FIG. 12 is a cross-sectional view showing a step of the method of manufacturing the organic EL display device in embodiment 1.

Then, as shown in FIG. 12, the second substrate 41 is removed. In the part irradiated with the third laser light 66, the second resin layer 42 is peeled off from the second substrate 41. As a result, the second resin layer 42 is left above the first substrate 31. By contrast, in the part not irradiated with the third laser light 66, the second resin layer 42 is removed together with the second substrate 41. In this manner, mere removal of the second substrate 41 results in a part of the second resin layer 42 that is in the region above the terminal portion 34 is selectively removed.

Figure 13:
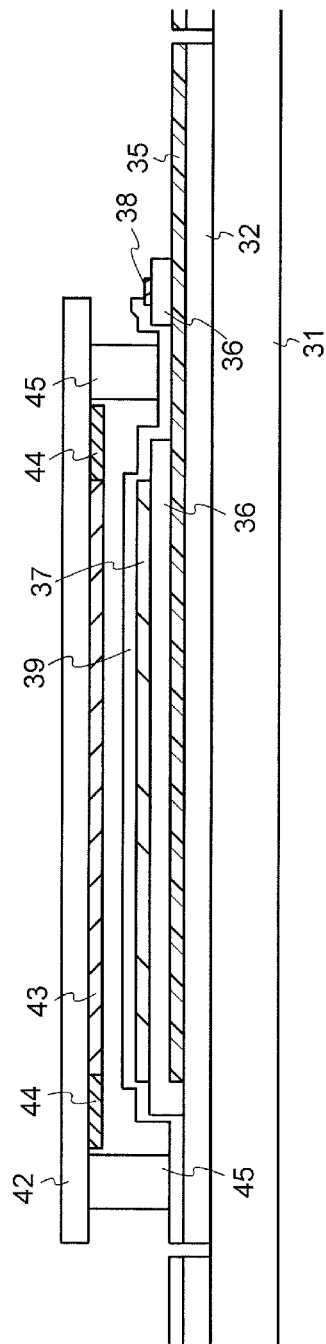
FIG. 13 is a cross-sectional view showing a step of the method of manufacturing the organic EL display device in embodiment 1.

Next, the protective layer 39 is etched in a self-aligned manner by use of the second resin layer 42 as a mask, so that as shown in FIG. 13, a part of the line 35 is exposed. Thus, the terminal portion 34 is exposed. Namely, exposure of the terminal portion 34 of the organic EL display device 10 is finished. It is preferable that the etching performed on the protective layer 39 is dry etching. A reason for this is that the etching is performed after the organic EL element 37 is formed and thus it is preferable to avoid, as much as possible, the organic EL element 37 from being exposed to moisture. In this embodiment, the protective layer 39 is formed of silicon nitride. Therefore, the dry etching on the protective layer 39 may be performed by use of, for example, a known gas material such as $CF_4$ (carbon fluoride) gas or the like.

In this embodiment, as described above with reference to FIG. 9, the second resin layer 42 is cut above the light blocking layer 38. Therefore, when the dry etching is performed by use of the second resin layer 42 as a mask, at least a part of the light blocking layer 38 is exposed. However, in this embodiment, the light blocking layer 38 is of the same layer structure as the positive electrode included in the organic EL element 37. Therefore, the light blocking layer 38 includes an uppermost layer formed of a transparent conductive material such as ITO or the like. This provides an advantage that even in the case where the light blocking layer 38 includes a metal layer containing silver, aluminum or the like having a light blocking property, such a metal layer is not exposed, and the problem of corrosion or the like is minimized.

Figure 14:
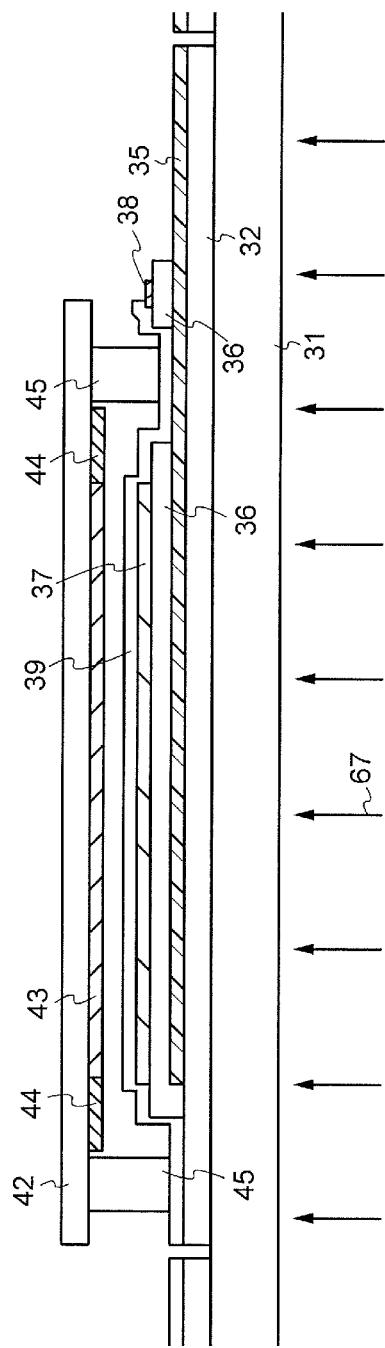
FIG. 14 is a cross-sectional view showing a step of the method of manufacturing the organic EL display device in embodiment 1.
Figure 15:
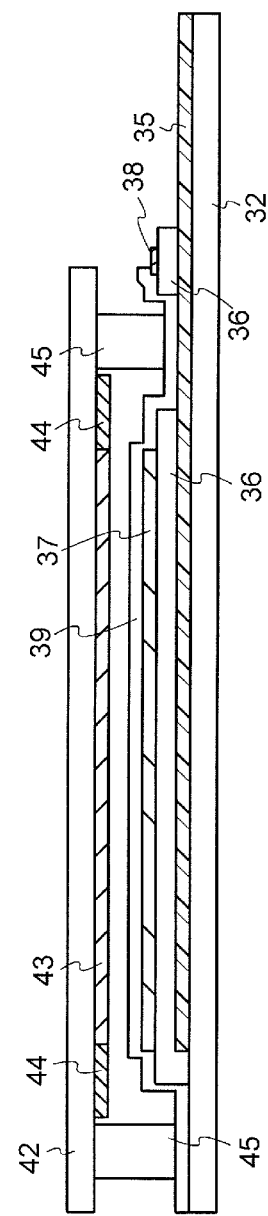
FIG. 15 is a cross-sectional view showing a step of the method of manufacturing the organic EL display device in embodiment 1.

Next, as shown in FIG. 14, the resultant assembly is irradiated with fourth laser light 67 directed toward the entirety of the first substrate 31. In this step, like in the step described above with reference to FIG. 11, an interface between the first substrate 31 and the first resin layer 32 is supplied with energy by the fourth laser light 67, which has power lower than that of each of the first laser light 61 and the second laser light 64. As a result, the adhesiveness between the first substrate 31 and the first resin layer 32 at the interface is decreased. Then, the first substrate 31 is peeled off from the first resin layer 32 and thus is removed. As a result, the organic EL display device 10 shown in FIG. 15 is manufactured.

As described above, in this embodiment, an element used for the positive electrode included in the organic EL element 37 is used for the light blocking layer 38, and thus a part of the second resin layer 42 that is in the region above the terminal portion 34 is selectively removed without any step being added to the method of manufacturing the organic EL display device 10. Before the first substrate 31 and the second substrate 32 are removed, the step of cutting the first resin layer 32 and the second resin layer 42 is finished. Therefore, mere removal of the second substrate 41 results in the organic EL display devices 10 being separated from each other and also results in a part of the second resin layer 42 that is in the region above the terminal portion 34 being removed. Namely, the terminal portions 34 are exposed in the same step in all the organic EL display devices 10. Thus, a simple method of manufacturing a display device having a high throughput is provided.

(Embodiment 2)

Figure 16:
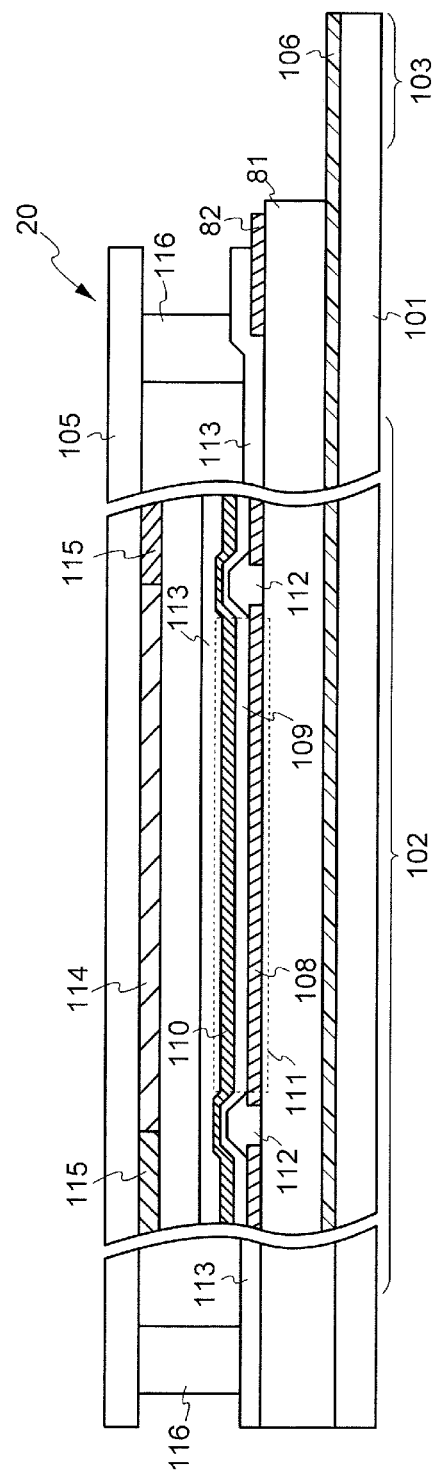
FIG. 16 is a cross-sectional view showing a structure of an organic EL display device in embodiment 2.

FIG. 16 shows a cross-sectional structure of an organic EL display device 20 in embodiment 2. Unlike in embodiment 1, in the organic EL display device 20 in embodiment 2, the insulating layer is left below the sealing member without being etched away and the light blocking layer is located also below the sealing member.

As shown in FIG. 16, an insulating layer 81 is selectively etched so as to be removed from the region where the terminal portion 103 is to be formed but so as to be left in the display portion 102 and in a region below a region where the sealing member 116 is to be formed. Such a structure decreases the amount of the material of the sealing member 116 and thus decreases the manufacturing cost.

In this embodiment, a light blocking layer 82 is located also below the sealing member 116. Such a structure allows the light blocking layer 82 to act as an etching stopper and thus to suppress etching gas used for the protective layer 113 and the laser light from entering the display portion 102. Especially, this structure prevents the inconvenience that the insulating layer 81 located below the sealing member 116 from being etched away.

The organic EL display device 20 in this embodiment may be manufactured by a method similar to the manufacturing method in embodiment 1, and the method of manufacturing the organic EL display device 20 provides effects similar to those of embodiment 1 described above.

The above-described embodiments according to the present invention may be appropriately combined together as long as no contradiction occurs. Any embodiment obtained as a result of any addition, deletion, or design change of an element or any addition, deletion or condition change of a step being performed appropriately by a person of ordinary skill in the art with respect to any of the above-described embodiments is encompassed in the scope of the present invention as long as including the gist of the present invention.

Even a function or effect other than the function or effect provided by the above-described embodiments but is apparent from the description of this specification or would have been obvious to a person of ordinary skill in the art is construed as being provided by the present invention.

What is claimed is:
1. A display device, comprising:
a first resin layer including a display portion, a terminal portion electrically connected with the display portion, and a light blocking layer located between the display portion and the terminal portion in a plan view, the display portion including a light emitting element including a positive electrode, a light emitting layer and a negative electrode, and the light blocking layer forming the same layer as the positive electrode and electrically isolated from the display portion and the terminal portion; and
a second resin layer bonded to the first resin layer so as to face the first resin layer.
2. The display device according to claim 1, wherein the positive electrode and the light blocking layer have the same layer structure as each other.

3. The display device according to claim 1, wherein the positive electrode and the light blocking layer are formed of a stacked film including a metal layer and a transparent conductive layer.

4. The display device according to claim 1, wherein the positive electrode and the light blocking layer are provided on an insulating layer, and the insulating layer is not provided on the terminal portion.

5. The display device according to claim 1, wherein the light emitting element is covered with a protective layer, and the protective layer is not provided on the light blocking layer or the terminal portion.

* * * * *